United States Patent
Liu et al.

(10) Patent No.: US 9,891,528 B2
(45) Date of Patent: Feb. 13, 2018

(54) EXTREME ULTRAVIOLET LITHOGRAPHY WITH REDUCED EXPOSURE DOSE AND NEGATIVE TONE DEVELOPMENT

(71) Applicant: Taiwan Semiconductor Manufacturing Co., Ltd., Hsin-Chu (TW)

(72) Inventors: Chen-Yu Liu, Kaohsiung (TW); Ching-Yu Chang, Yilang County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 51 days.

(21) Appl. No.: 15/182,160

(22) Filed: Jun. 14, 2016

(65) Prior Publication Data

US 2017/0315447 A1 Nov. 2, 2017

Related U.S. Application Data

(60) Provisional application No. 62/330,325, filed on May 2, 2016.

(51) Int. Cl.
| | |
|---|---|
| *G03F 7/20* | (2006.01) |
| *G03F 7/40* | (2006.01) |
| *G03F 7/32* | (2006.01) |
| *G03F 7/16* | (2006.01) |

(52) U.S. Cl.
CPC ............... *G03F 7/40* (2013.01); *G03F 7/168* (2013.01); *G03F 7/2004* (2013.01); *G03F 7/2022* (2013.01); *G03F 7/325* (2013.01); *G03F 7/405* (2013.01)

(58) Field of Classification Search
CPC .......... G03F 7/40; G03F 7/168; G03F 7/2004; G03F 7/2022; G03F 7/325; G03F 7/405
USPC .......... 430/30, 324, 325, 328, 330, 331, 394
See application file for complete search history.

(56) References Cited

U.S. PATENT DOCUMENTS

| | | |
|---|---|---|
| 8,039,195 B2 | 10/2011 | Shih et al. |
| 8,216,767 B2 | 7/2012 | Wang et al. |
| 8,323,870 B2 | 12/2012 | Lee et al. |
| 8,580,117 B2 | 11/2013 | Kao et al. |
| 8,628,897 B1 | 1/2014 | Lu et al. |
| 8,658,344 B2 | 2/2014 | Wang et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,715,919 B2 | 5/2014 | Chang et al. |
| 8,722,286 B2 | 5/2014 | Yu et al. |
| 8,741,551 B2 | 6/2014 | Wu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |

*Primary Examiner* — Christopher G Young

(74) *Attorney, Agent, or Firm* — Haynes and Boone, LLP

(57) ABSTRACT

A method of lithography patterning includes forming a resist layer over a substrate and providing a radiation with a first exposure dose to define an opening to be formed in the resist layer. The opening is to have a target critical dimension $CD_1$ after developed by a negativ-tone development (NTD) process. The method further includes exposing the resist layer to the radiation with a second exposure dose less than the first exposure dose and developing the resist layer in a negative-tone development process to remove unexposed portions of the resist layer, resulting in an opening between resist patterns. A critical dimension $CD_2$ of the opening is greater than $CD_1$ by a delta. The method further includes forming an interfacial layer on sidewalls of the resist patterns. The interfacial layer has a thickness that is substantially equal to half of the delta.

20 Claims, 12 Drawing Sheets

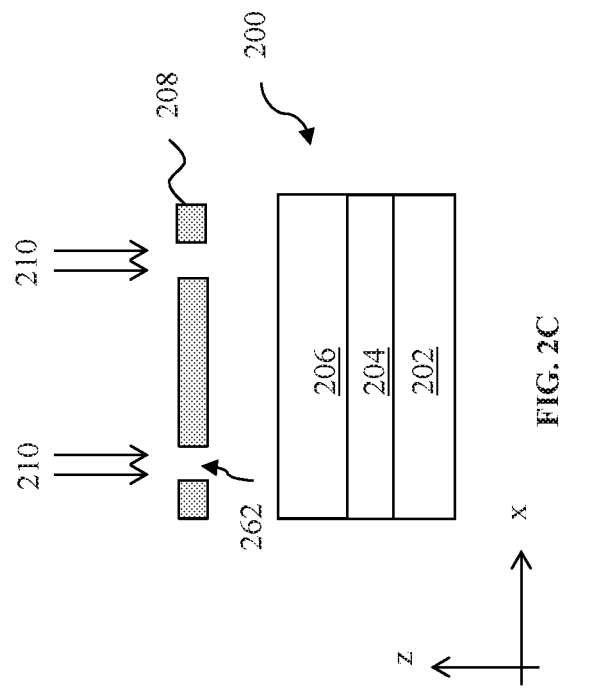
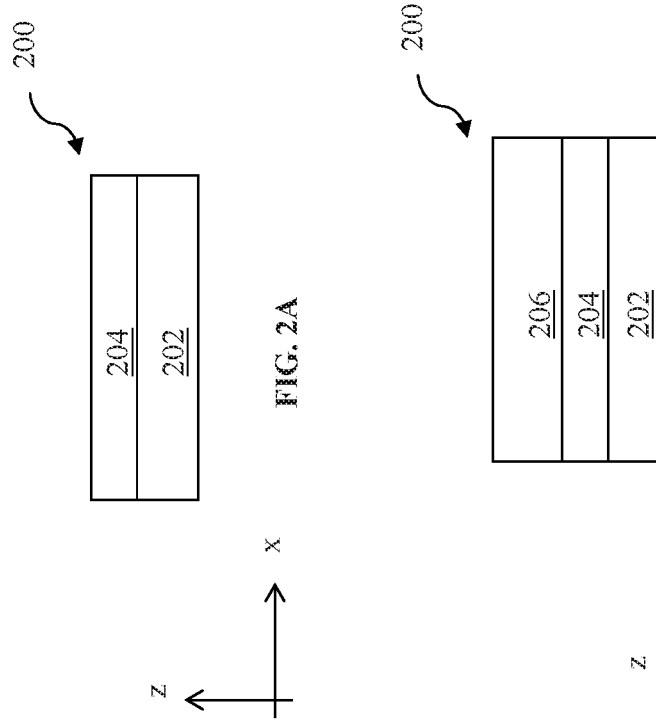
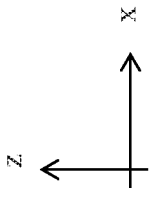

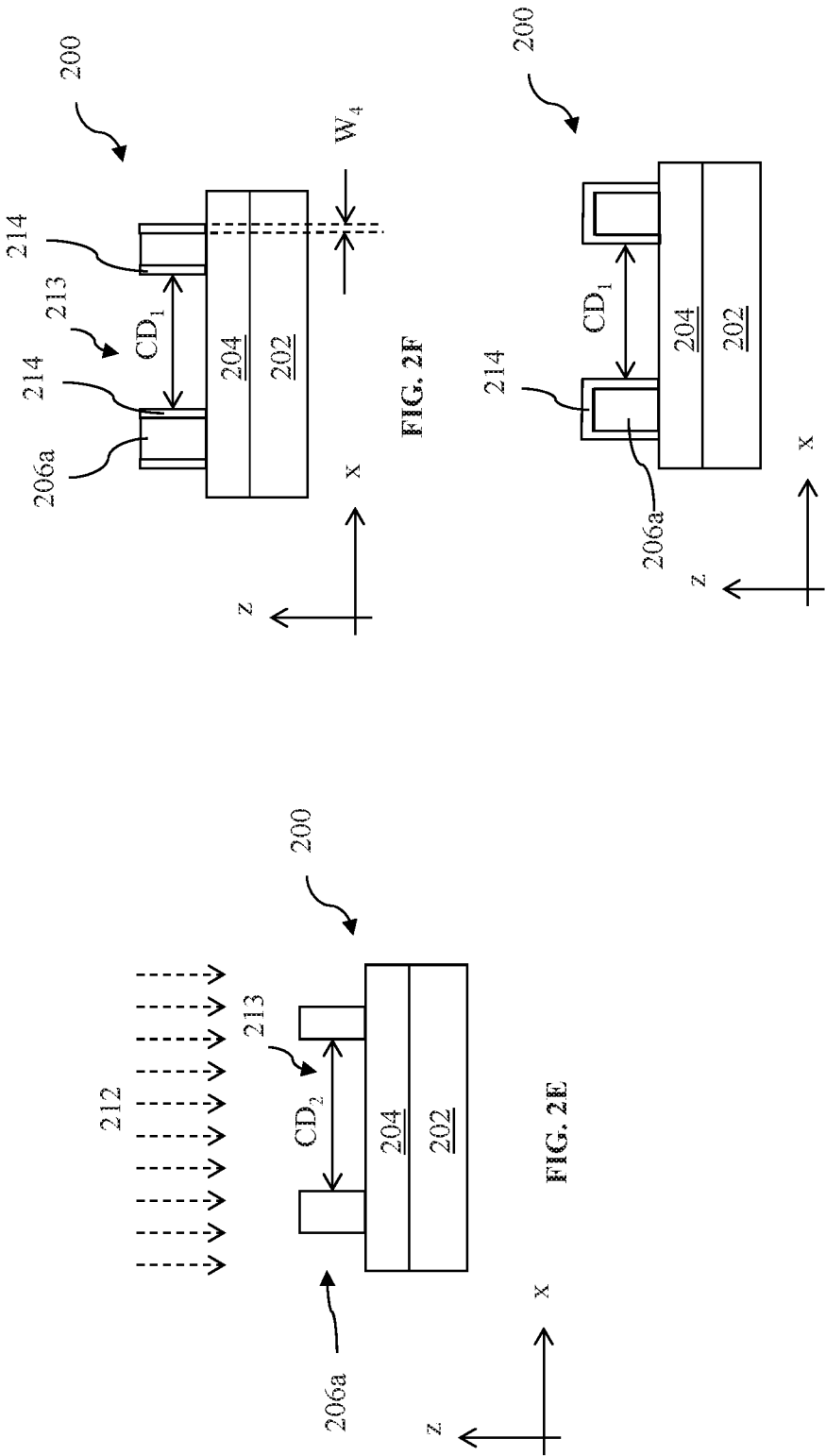

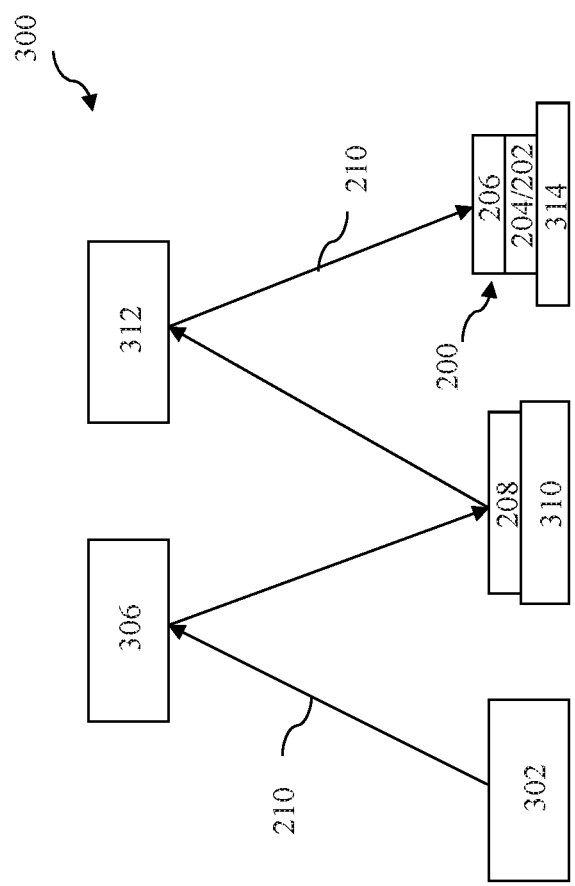

EXTREME ULTRAVIOLET LITHOGRAPHY WITH REDUCED EXPOSURE DOSE AND NEGATIVE TONE DEVELOPMENT

PRIORITY

This claims the benefit of U.S. provisional application Ser. No. 62/330,325, entitled "Extreme Ultraviolet Lithography with Reduced Exposure Dose and Negative-Tone Development," filed May 2, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. This scaling down process generally provides benefits by increasing production efficiency and lowering associated costs. Such scaling down has also increased the complexity of processing and manufacturing ICs. For these technological advancements to be realized, similar developments in IC processing and manufacturing are needed.

For example, extreme ultraviolet (EUV) lithography has been utilized to support critical dimension (CD) requirements of smaller devices. EUV lithography employs scanners using radiation in the EUV region, having a wavelength of about 1-100 nm. Currently, EUV lithography has a limited production capacity, partly because typical EUV sources cannot provide large enough radiation powers. For example, a typical EUV source can only generate about 80 W radiation powers, while it needs about 250 W to satisfy volume production. To overcome this issue, some efforts have been spent on increasing EUV resist sensitivity. However, as resist sensitivity increases, the line edge roughness (LER) and line width roughness (LWR) of the developed resist patterns also increase. This leads to decreased critical dimension uniformity (CDU) and degraded circuit performance.

Accordingly, while existing EUV lithography methods are generally adequate for their intended purposes, they are not entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, 2C, 2E, 2F, 2F-1, 2G, and 2H are cross-sectional views of a portion of a semiconductor device in various fabrication stages according to the method in FIGS. 1A-1E, in accordance to an embodiment.

FIGS. 2D-1 and 2D-2 shows exemplary relations between lithography radiation exposure doses and critical dimensions of expected resist patterns.

FIG. 4 illustrates a lithography system that may be employed by and benefit from the method of FIGS. 1A-1E, in accordance with some embodiments.

DETAILED DESCRIPTION

Figure 1A:
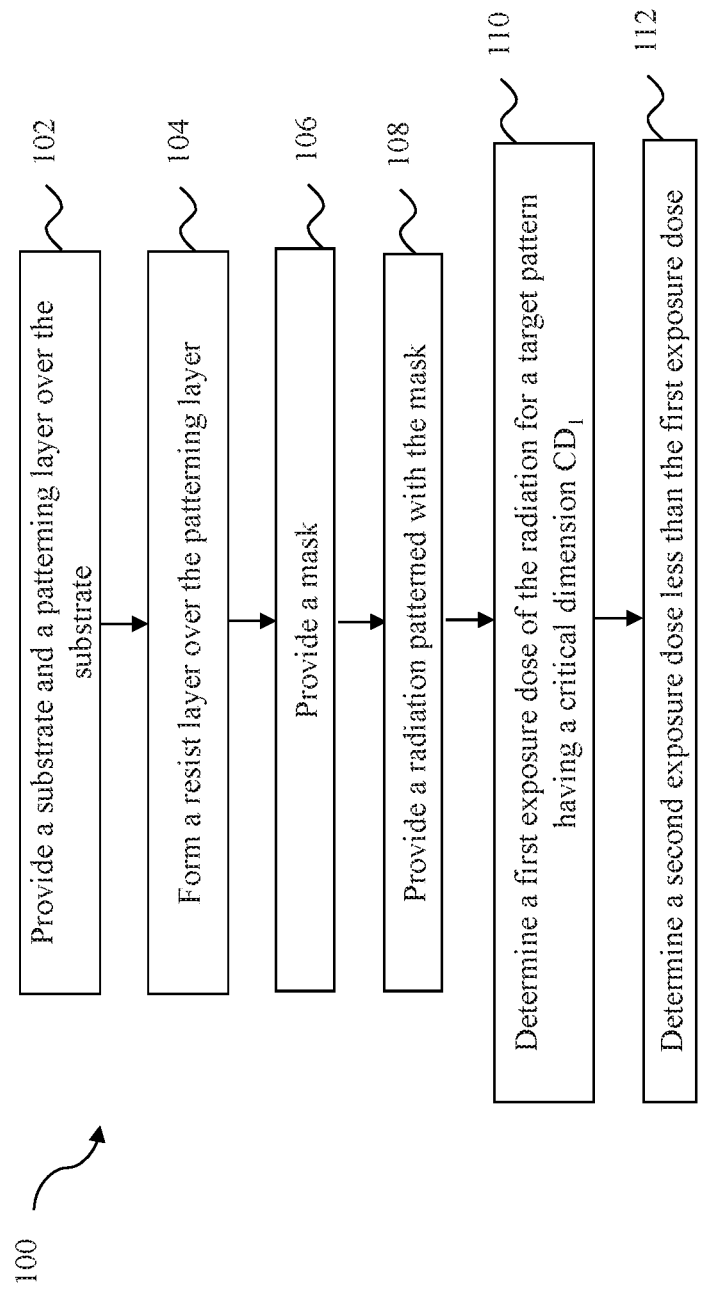
FIGS. 1A and 1B are a flow chart of a method of lithography patterning, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relation between the various embodiments and/or configurations discussed.

Further, spatially relative terms, such as "beneath," "below," "lower," "above," "upper" and the like, may be used herein for ease of description to describe one element or feature's relation to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to methods of EUV lithography patterning. Instead of seeking to increase the existing EUV radiation powers or to increase the existing EUV resist sensitivity, embodiments of the present disclosure use a different approach to increase EUV lithography productivity, to achieve a target CD, and to reduce LER and LWR of the developed resist patterns. An embodiment of the present disclosure uses a two-step approach. In the first step, it uses a reduced EUV exposure dose to irradiate a resist and then develops the resist using a negative-tone development (NTD) process. This step uses the same photomask (or mask) that is used for typical EUV lithography, but uses a smaller EUV exposure dose (less radiation power) than the typical would-be-needed EUV exposure dose. The smaller EUV exposure dose leads to a CD greater than the target CD. In the second step, it performs a shrinking process to reduce the CD of the developed resist patterns to match the target CD. The two-step approach effectively reduces the LER and LWR of the final patterns while requiring less EUV radiation powers.

Embodiments of the present disclosure can be implemented with existing EUV equipment and existing resists, thereby saving development costs.

Figure 1B:
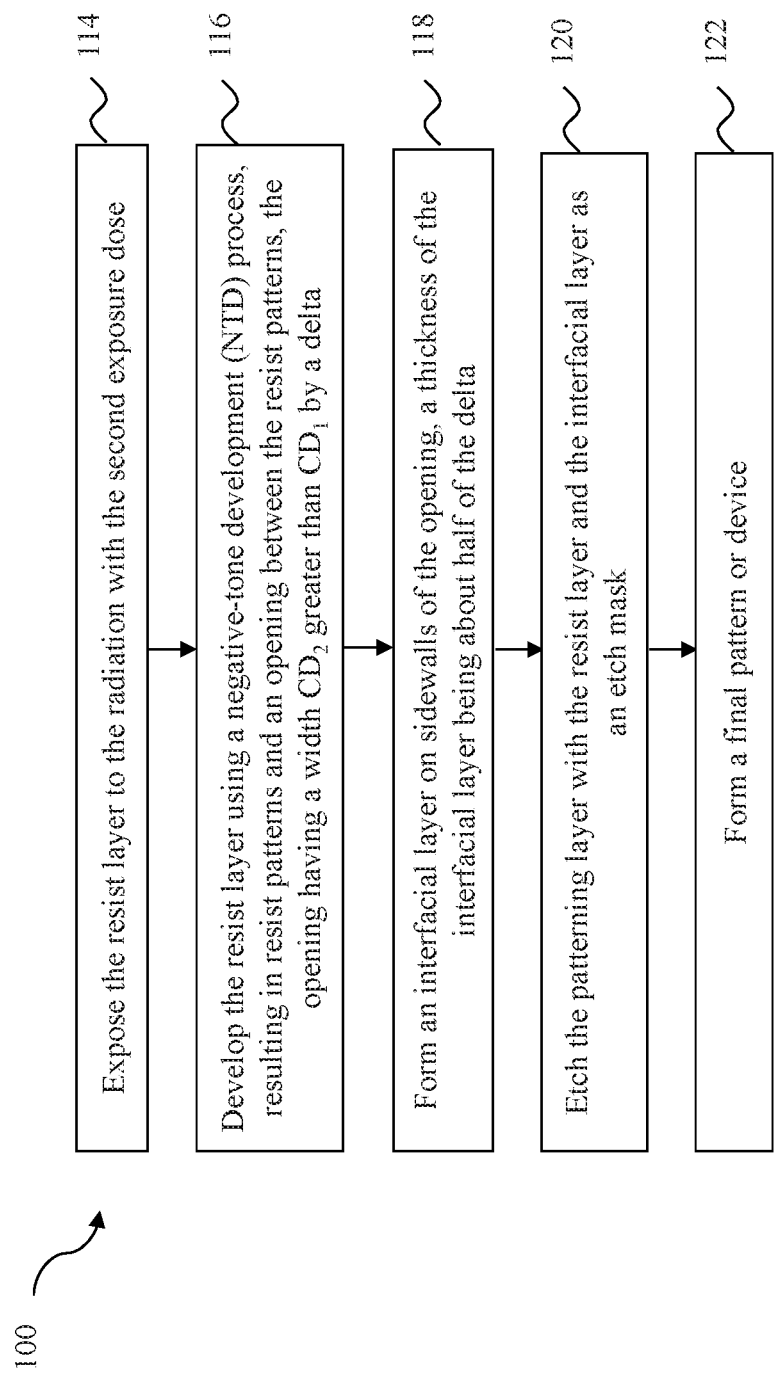

FIGS. 1A and 1B are a flow chart of a method 100 of patterning a substrate (e.g., a semiconductor wafer) according to various aspects of the present disclosure. The method 100 may be implemented, in whole or in part, by a system employing deep ultraviolet (DUV) lithography, extreme ultraviolet (EUV) lithography, electron beam (e-beam) lithography, x-ray lithography, and other lithography processes to improve pattern dimension accuracy. In the present embodiment, EUV lithography is used as the primary example. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims. The method 100 is described below in conjunction with FIGS. 2A-2H wherein a semiconductor device 200 is fabricated using embodiments of the method 100. The semiconductor device 200 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

At operation 102, the method 100 (FIG. 1A) provides (or is provided with) a substrate 202 and a patterning layer 204 over the substrate 202. Referring to FIG. 2A, the substrate 202 includes one or more layers of material or composition. In an embodiment, the substrate 202 is a semiconductor substrate (e.g., wafer). In another embodiment, the substrate 202 includes silicon in a crystalline structure. In alternative embodiments, the substrate 202 includes other elementary semiconductors such as germanium; a compound semiconductor such as silicon carbide, gallium arsenide, indium arsenide, and indium phosphide; an alloy semiconductor such as GaAsP, AlInAs, AlGaAs, InGaAs, GaInP, and/or GaInAsP; or combinations thereof. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

In an embodiment, the patterning layer 204 is a hard mask layer including material(s) such as amorphous silicon (a-Si), silicon oxide, silicon nitride (SiN), titanium nitride, or other suitable material or composition. In an embodiment, the patterning layer 204 is an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the patterning layer 204 may include a high-k dielectric layer, a gate layer, a hard mask layer, an interfacial layer, a capping layer, a diffusion/barrier layer, a dielectric layer, a conductive layer, other suitable layers, and/or combinations thereof. The patterning layer 204 may be formed over the substrate 202 by one or more deposition techniques such as physical vapor deposition, chemical vapor deposition, and atomic layer deposition.

The method 100 (FIG. 1A) proceeds to operations 104 by forming a resist (or photoresist) layer 206 over the substrate 202 and the patterning layer 204 (FIG. 2B). Referring to FIG. 2B, in an embodiment, the resist layer 206 is formed by spin-on coating a liquid polymeric material onto the patterning layer 204. In an embodiment, the resist layer 206 is further treated with a soft baking process and a hard baking process. In the present embodiment, the resist layer 206 is sensitive to a EUV radiation, and is further used for NTD development, i.e., its solubility in a NTD developer decreases upon EUV radiation. The resist layer 206 contains cross-linkable polymer and cross-linker(s) and may include a Polyhydroxystyrene (PHS) resist. For example, the PHS resist may be a part of a copolymer in the resist layer 206, or may be blended with another polymer to form the resist layer 206.

Figure 3:
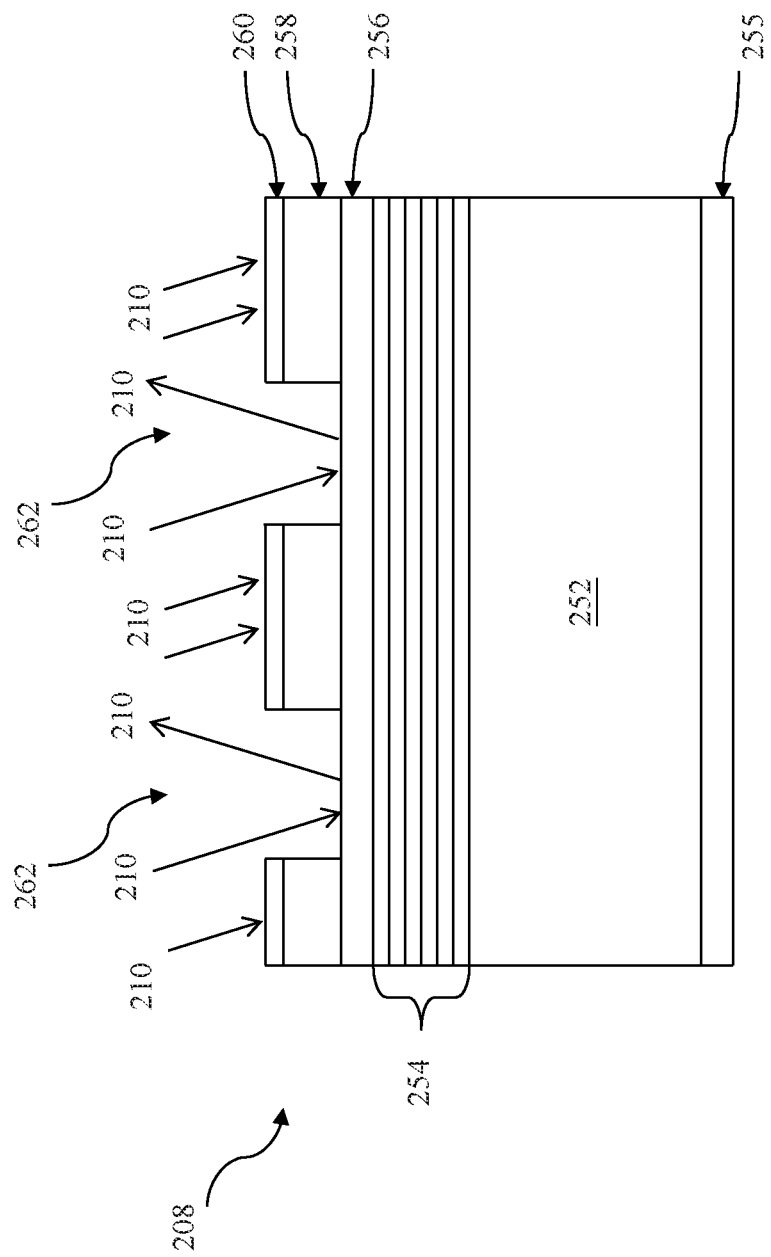
FIG. 3 illustrates a EUV mask that may be employed by the method of FIGS. 1A-1D, in accordance with some embodiments.

The method 100 (FIG. 1A) proceeds to operation 106 by providing a mask 208. The mask 208 may be a transmissive mask or a reflective mask, and may include resolution enhancement techniques such as phase-shifting and/or optical proximity correction (OPC). In the present embodiment, the mask 208 is a EUV mask, an example of which is shown in FIG. 3. Referring to FIG. 3, the mask 208 includes a low thermal expansion material (LTEM) layer 252, a reflective multilayer (ML) 254 over the LTEM layer 252, a capping layer 256 over the reflective ML 254, an absorber layer 258 over the capping layer 256, and a protection layer 260 over the absorber layer 258. In addition, a conductive layer 255 may be deposited under the LTEM layer 252 for electrostatic chucking purposes. The LTEM layer 252 may include fused silica, fused quartz, calcium fluoride ($CaF_2$), silicon carbide, silicon oxide-titanium oxide alloy and/or other suitable LTEM. The reflective ML 254 may include a plurality of film pairs, such as molybdenum-silicon (Mo/Si) film pairs, molybdenum-beryllium (Mo/Be) film pairs, or any two materials or two material combinations with large difference in refractive indices and small extinction coefficients for effectively reflecting a projection thereon, such as EUV radiation 210.

The capping layer 256 may include ruthenium (Ru) or Ru compounds such as ruthenium-boron (RuB) or ruthenium-silicon (RuSi). The absorber layer 258 absorbs the EUV radiation 210 projected thereon. The absorber layer 258 may include a single layer or multiple layers from a group of chromium (Cr), chromium oxide (CrO), titanium nitride (TiN), tantalum nitride (TaN), tantalum (Ta), titanium (Ti), or aluminum-copper (Al-Cu), palladium, tantalum boron nitride (TaBN), aluminum oxide (AlO), molybdenum (Mo), or other suitable materials. The protection layer 260 protects the absorber layer 258 from oxidation or other erosions and may include tantalum boron oxide (TaBO). In the present embodiment, the absorber layer 258 and the protection layer 260 are patterned with IC patterns, thereby providing openings 262 where the EUV radiation 210 is reflected.

At operation 108, the method 100 (FIG. 1A) provides the radiation 210 that is patterned with the mask 208. The radiation 210 is generated and patterned in a lithography system, such as the EUV lithography system 300 (FIG. 4). Referring to FIG. 4, the EUV lithography system 300 includes a radiation source 302 that produces the radiation 210, condenser optics 306, a mask stage 310 securing the mask 208 thereon, projection optics 312, and a substrate stage 314 securing the device 200 including the substrate 202, the patterning layer 204, and the resist layer 206. Other configurations and inclusion or omission of items may be possible. In the present disclosure, the EUV lithography system 300 may be a stepper or a scanner.

The radiation source 302 provides the radiation 210 having a wavelength in the EUV range, such as about 1-100 nm. In an embodiment, the radiation 210 has a wavelength of about 13.5 nm. Furthermore, an exposure dose of the radiation 210 is tunable within a range according to the power capacity of the radiation source 302.

The condenser optics 306 includes a multilayer coated collector and a plurality of grazing mirrors. The condenser optics 306 is configured to collect and shape the radiation 210 and to provide a slit of the radiation 210 to the mask 208. The mask 208 provides a patterned aerial image to the radiation 210, and the patterned aerial image corresponds to the IC patterns to be exposed onto the resist layer 206. The mask stage 310 secures the mask 208, such as by vacuum, and provides accurate position and movement of the mask 208 during alignment, focus, leveling and exposure operation in the EUV lithography system 300.

The projection optics 312 includes one or more lens and a plurality of mirrors. The lens may have a magnification of less than one thereby reducing the patterned aerial image of the mask 208 to the device 200, particularly, to the resist layer 206. The device 200 is secured by the substrate stage 314 which provides accurate position and movement of the device 200 during alignment, focus, leveling and exposing operation in the EUV lithography system 300 such that the patterned aerial image of the mask 208 is exposed onto the resist layer 206 in a repetitive fashion (though other lithography methods are possible). The irradiated portions of the resist layer 206 become insoluble in a NTD developer.

At operation 110, the method 100 (FIG. 1A) determines a first exposure dose of the radiation 210 in order to form a resist pattern in the resist layer 206 with a target critical dimension $CD_1$. The $CD_1$ matches a dimension of the patterns to be formed on the resist layer 206. The patterns are geometric shapes for one or more IC features to be formed in or on the substrate 202 that may be fins for FinFET devices; contact holes for source, drain, or gate features; or other types of IC features. The proper amount of the first exposure dose may depend on a variety of factors such as pattern shapes and pattern density (e.g., isolated pattern or dense pattern) on the mask 208, reflectivity of the mask 208, sensitivity (or exposure threshold) of the resist layer 206, thickness of the resist layer 206, resist film loss during the NTD development, exposure dose variations among multiple shots, temperature(s) during a post-exposure baking (PEB) of the resist layer 206, length of time during the PEB, and length of time and types of solvent for developing the resist layer 206.

Figure 1C:
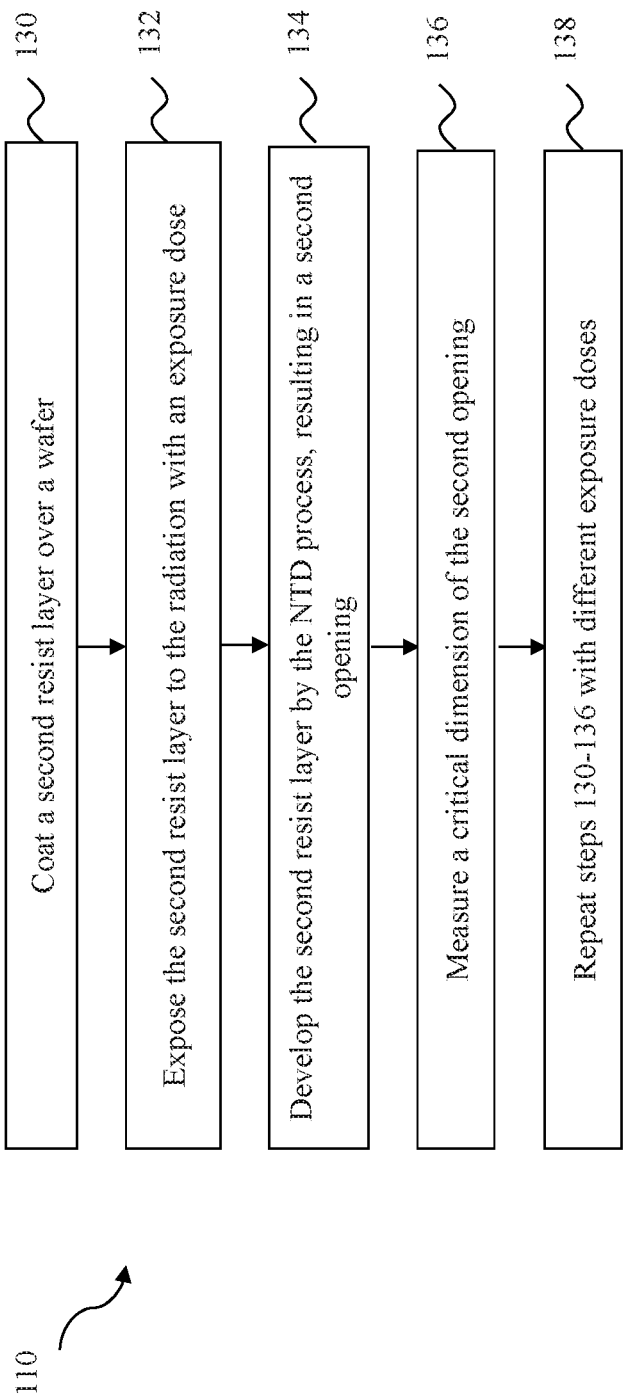
FIG. 1C is a flow chart of a method of characterization for lithography patterning, according to various aspects of the present disclosure.
Figure 1D:
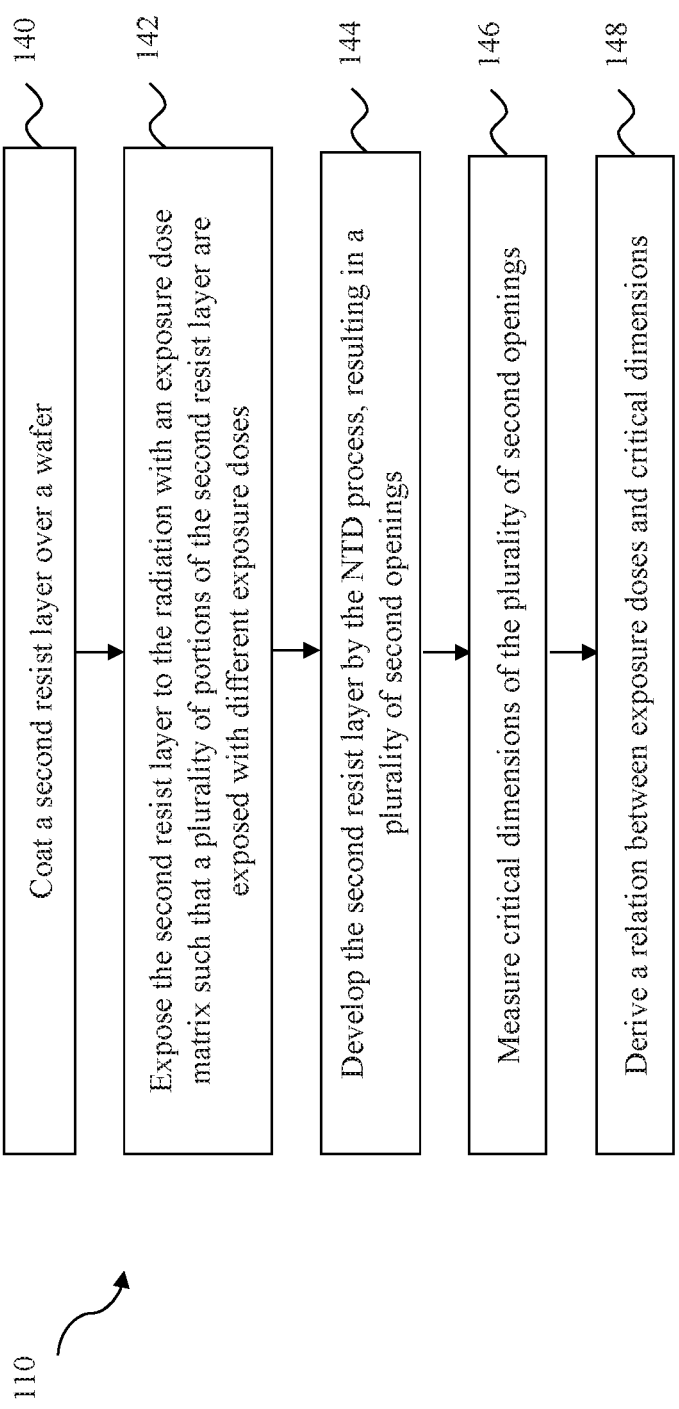
FIG. 1D is a flow chart of another method of characterization for lithography patterning, according to various aspects of the present disclosure.

In an embodiment, in order to determine the first exposure dose, the method 100 performs a characterization process, an embodiment of which is illustrated in FIG. 1C and another embodiment of which is illustrated in FIG. 1D.

Referring to FIG. 1C, in the present embodiment, the operation 110 includes steps 130, 132, 134, 136, and 138. In step 130, the operation 110 forms a second resist layer on a wafer. The second resist layer uses the same resist material as the resist layer 206 and is formed to have about the same thickness as the resist layer 206. The wafer may be a test wafer in an embodiment. Alternatively, it can be a production wafer, such as the substrate 202. The second resist layer may be formed by spin-coating and baking processes as discussed above. In the step 132, the operation 110 exposes the second resist layer to the radiation 210, such as in the lithography system 300. The operation 110 uses an exposure dose (mJ/cm$^2$) based on estimation such as from prior experiences, or based on a calculation derived from the variety of factors discussed above. The exposure dose is within the capacity of the radiation source 302.

In the step 134, the operation 110 develops the exposed second resist layer in an NTD process 212 such as shown in FIG. 2E. Even though FIG. 2E illustrates the resist layer 206 being developed by the NTD process 212, the same concepts apply to the developing of the second resist layer in the operation 110. Referring to FIG. 2E, the NTD process 212 uses a developer that dissolves unexposed portions of the second resist layer. The developer may include one or more materials selected from the group consisting of 2-heptanone, n-butyl acetate, isoamyl acetate, cyclohexanone, 2-heptanone, 5-methyl-2-hexanone, methyl-2-hydroxyisobutyrate, ethyl lactate, propylene glycol monomethyl ether acetate, n-pentyl acetate, n-butyl propionate, n-hexyl acetate, n-butyl butyrate, isobutyl butyrate, 2,5-dimethyl-4-hexanone, and 2,6-dimethyl-4-heptanone. The step 134 may include other processes, such as cleaning the developed resist patterns. As a result of the step 134, an opening 213 is formed between resist patterns as shown in FIG. 2E.

In the step 136, the operation 110 performs an after-development-inspection (ADI) process. In the present embodiment, the ADI process includes measuring a CD of the opening 213. The ADI process may further include measuring LER, LWR, and CDU of the developed resist patterns. Particularly, the operation 110 determines if the measured CD matches the target $CD_1$ within an acceptable margin. In the step 138, the operation 110 repeats the steps 130, 132, 134, and 136. In each repetition, the operation 110 adjusts the exposure dose in the step 132 up or down from the previous repetition in order to derive a series of relations between the exposure doses and the CD of the exposed and developed resist patterns.

Figures 1, 2D:
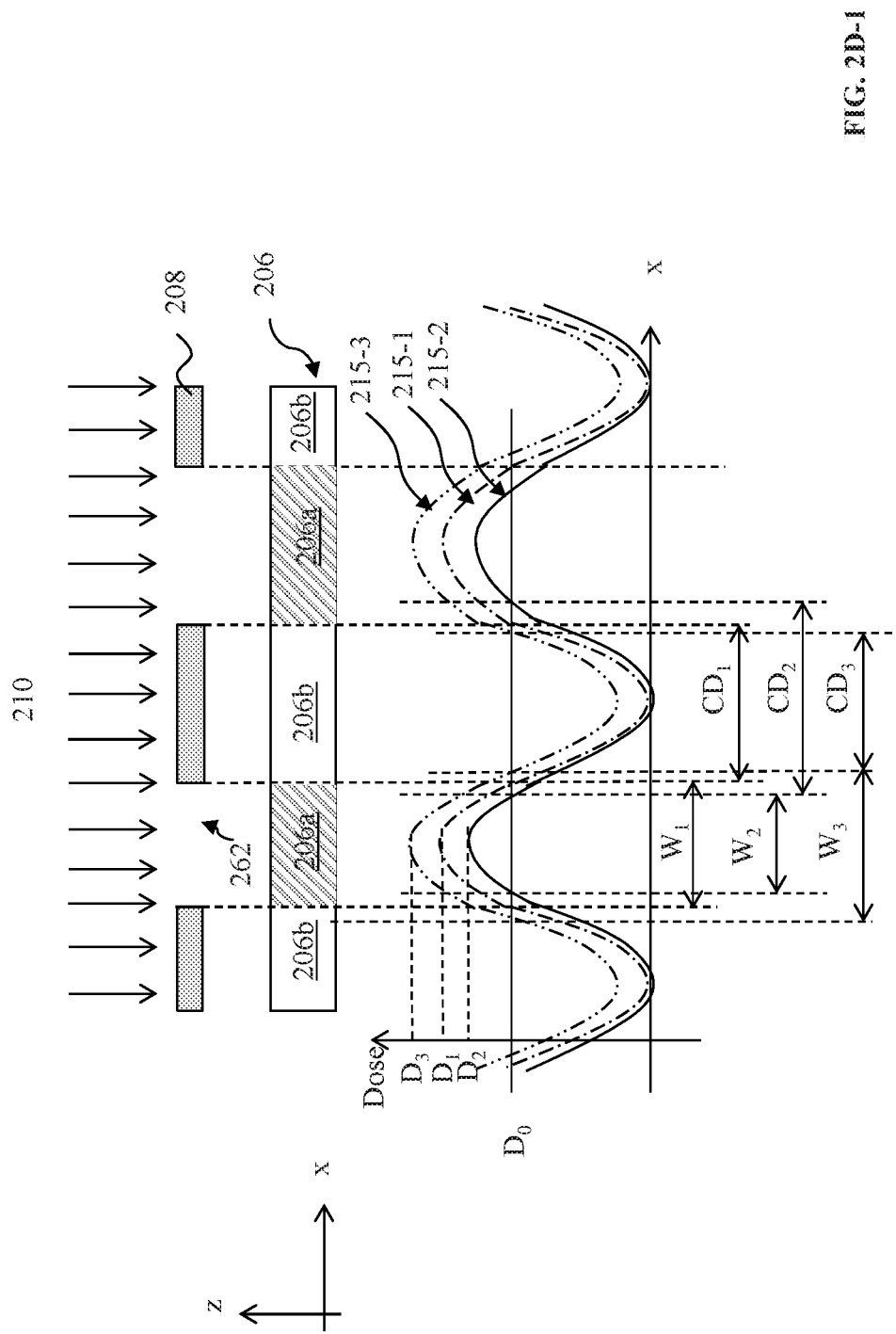

An example of the relations is graphically illustrated in FIG. 2D-1. Referring to FIG. 2D-1, patterned with the mask 208, the radiation 210 irradiates portions 206a (the shaded areas in FIG. 2D-1) of the resist layer 206, while it is blocked by the mask 208 from irradiating remaining portions 206b of the resist layer 206. The shaded areas 206a correspond to the openings 262 in the absorber layer 258 of the mask 208 (FIG. 3). Ideally, the shaded areas 206a are fully exposed while the remaining portions 206b are not exposed at all. However, in reality, this may not be the case because the energy of the radiation 210 generally is not linearly distributed within the shaded areas 206a. For example, it may have a Gaussian distribution in an example. FIG. 2D-1 further illustrates a threshold $D_0$ of the resist layer 206. The threshold $D_0$ may be simply illustrated as follows. When an area of the resist layer 206 receives radiation energy above $D_0$, the corresponding area (also vertically through the resist layer 206) becomes insoluble in the NTD process 212. Conversely, when an area of the resist layer 206 receives radiation energy below $D_0$, the corresponding area remains soluble in the NTD process 212.

FIG. 2D-1 further illustrates three exposure doses $D_1$, $D_2$ and $D_3$ of the radiation 210 and the results of the exposure as shown by the curves 215-1, 215-2, and 215-3 respectively. The horizontal axis "x" indicates the dimension of the resist layer 206 along a critical dimension of interest, while the vertical axis "Dose" indicates the amount of exposure dose of the radiation 210. When the radiation 210 is provided with the exposure dose $D_1$, the shaded areas 206a are fully exposed and the resist patterns have a width $W_1$ along the "x" direction. Furthermore, an opening with a width $CD_1$ is formed between the resist patterns. In the present embodiment, the $CD_1$ matches the target CD of the resist patterns within an acceptable margin, such as within 3% of the target CD. Accordingly, the exposure dose $D_1$ is the first exposure dose sought by the operation 110. When the radiation 210 is provided with the exposure dose $D_2$ that is less than $D_1$, the shaded areas 206a are not fully exposed and the resist patterns have a width $W_2$ along the "x" direction, which is smaller than $W_1$. Consequently, the opening has a width $CD_2$ greater than $CD_1$. When the radiation 210 is provided with the exposure dose $D_3$ greater than $D_1$, not only are the shaded areas 206a fully exposed, adjacent portions 206b are also partially exposed because the radiation 210 bleeds into those adjacent areas. As a result, the resist patterns have a width $W_3$ along the "x" direction, which is greater than $W_1$ and the opening has a width $CD_3$ smaller than $CD_1$. In embodiments, the operation 110 may derive other exposure curves that are above or below the curve 215-1.

Referring to FIG. 1D, in the present embodiment, the operation 110 includes steps 140, 142, 144, 146, and 148. In step 140, the operation 110 forms a second resist layer on a wafer. The second resist layer uses the same resist material as the resist layer 206 and is formed to have about the same thickness as the resist layer 206. The wafer may be a test wafer in an embodiment. Alternatively, it can be a production wafer, such as the substrate 202. The second resist layer may be formed by spin-coating and baking processes as discussed above. In step 142, the operation 110 exposes the second resist layer to the radiation 210, such as in the lithography system 300. The operation 110 uses an exposure dose ($mJ/cm^2$) matrix. The exposure dose matrix specifies a plurality of different exposure doses for a plurality of different portions of the second resist layer. For example, the operation 110 may expose a plurality of devices or IC dies on the second resist layer, and the exposure dose matrix specifies the amount of exposure doses to be applied to each of the plurality of devices. Accordingly, step 142 results in different portions of the second resist layer being exposed to different exposure doses of the radiation.

In step 144, the operation 110 develops the exposed second resist layer in an NTD process 212 such as shown in FIG. 2F. Even though FIG. 2F illustrates the resist layer 206 being developed by the NTD process 212, the same concepts apply to the developing of the second resist layer in the operation 110. Referring to FIG. 2F, the NTD process 212 uses a developer that dissolves unexposed portions of the second resist layer. The developer may include one or more materials selected from the group consisting of 2-heptanone, n-butyl acetate, isoamyl acetate, cyclohexanone, 2-heptanone, 5-methyl-2-hexanone, methyl-2-hydroxyisobutyrate, ethyl lactate, propylene glycol monomethyl ether acetate, n-pentyl acetate, n-butyl propionate, n-hexyl acetate, n-butyl butyrate, isobutyl butyrate, 2,5-dimethyl-4-hexanone, and 2,6-dimethyl-4-heptanone. The step 144 may include other processes, such as cleaning the developed resist patterns. As a result of the step 144, a plurality of openings 213 are formed between resist patterns as shown in FIG. 2F. The plurality of openings 213 correspond to the plurality of exposure doses applied in step 132. In embodiments, the openings 213 may correspond to IC circuit features to be formed in the substrate 202, such as wire trenches, contact holes, via holes, or other suitable features.

Figures 2, 2D:
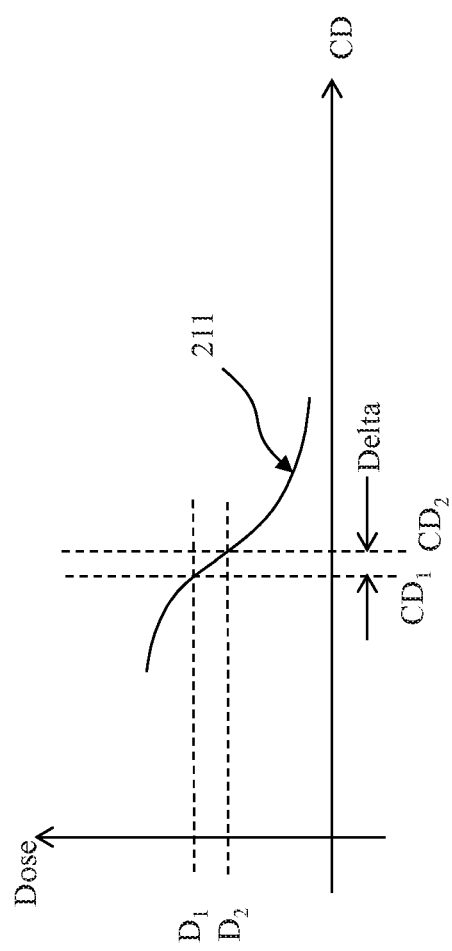

In step 146, the operation 110 performs an after-development-inspection (ADI) process. In the present embodiment, the ADI process includes measuring a CD of each of the openings 213. The ADI process may further include measuring LER, LWR, and CDU of the developed resist patterns. In step 148, the operation 110 derives a relation between the exposure doses and the CD of the openings. An example of the relation is shown in FIG. 2D-2 as a graph 211. Referring to FIG. 2D-2, the horizontal axis represents the CD of the openings, and the vertical axis represents the exposure doses used in step 132. Particularly, the graph 211 shows that when the exposure doses are $D_1$ and $D_2$, the openings 213 have a critical dimension of $CD_1$ and $CD_2$ respectively.

In another embodiment, the operation 110 determines the relations between the exposure doses and the CD of the developed resist patterns by running a series of simulations instead of performing the steps 130-138 and 140-148 with actual wafers and resist materials. For example, the simulations may take into account various factors affecting lithography performance, such as pattern shapes and pattern density on the mask 208, reflectivity of the mask 208, sensitivity of the resist layer 206, thickness of the resist layer 206, resist film loss during the NTD development, depth of focus, exposure dose variations among multiple exposure shots, temperature(s) during PEB, length of time of the PEB, and length of time and types of solvent for developing the resist layer 206. These factors may be obtained from prior manufacturing data. By running the simulations, the operation 110 may derive curves as shown in FIGS. 2D-1 and 2D-2, and determine the first exposure dose D1 from the curves.

At operation 112, instead of using the first exposure dose $D_1$, the method 100 (FIG. 1A) determines a second exposure dose that is less than $D_1$. Even though the exposure dose $D_1$ leads to acceptable CD in the resist patterns, the LER and LWR of the resist patterns sometimes may not be acceptable. The LER and LWR of the resist patterns may be caused by a variety of factors such as the shot noise and the bleeding of the radiation 210; the molecular structure and properties of the resist layer 206 such as solubility, molecular weights, molecular dispersity, and monomer polarity and sequences; and the properties of the developer in the NTD process 212. Sometimes, it is difficult to simultaneously optimize the CD of the resist patterns, the resist sensitivity, and the LER/LWR of the resist patterns. In the present embodiment, the operation 112 selects the second exposure dose $D_2$ such that the resultant resist patterns have a critical dimension $CD_2$ greater than $CD_1$ by a value "Delta." The Delta is approximately equal to twice a thickness of an interfacial layer to be later formed, which will be discussed with respect to operation 118. The Delta is within a range that can be manufactured by the operation 118. In an embodiment, the Delta ranges from 1 nanometer (nm) to 10 nm. In an embodiment, the Delta is a percentage of the target $CD_1$. For example, the Delta is about 5%-30% of $CD_1$. In the present embodiment, the operation 112 selects $D_2$ based on the target critical dimension $CD_1$, the target exposure dose $D_1$, the Delta, and the series of relations characterized by the operation 110, such as shown in FIGS. 2D-1 and 2D-2, and may interpolate multiple exposure curves. For example, with respect to FIG. 2D-2, the $CD_1$ and $D_1$ have been determined prior to or in the operation 110, then the operation 112 determines $CD_2$ which is $CD_1$+Delta, and determines $D_2$ from the graph 211 corresponding to $CD_2$.

At operation 114, the method 100 (FIG. 1B) exposes the resist layer 206. In the present embodiment, the operation 114 exposes the resist layer 206 using the lithography system 300 and uses the exposure dose $D_2$ as determined by the operations 110 and 112. The exposure operation is illustrated in FIGS. 2C and 2D-1. Particularly, the shaded areas 206a are under-exposed (FIG. 2D-1).

At operation 116, the method 100 (FIG. 1B) develops the exposed resist layer 206 in the NTD process 212 (FIG. 2E). In the present embodiment, the NTD process 212 uses a developer that includes one of: 2-heptanone, n-butyl acetate, isoamyl acetate, cyclohexanone, 2-heptanone, 5-methyl-2-hexanone, methyl-2-hydroxyisobutyrate, ethyl lactate, propylene glycol monomethyl ether acetate, n-pentyl acetate, n-butyl propionate, n-hexyl acetate, n-butyl butyrate, isobutyl butyrate, 2,5-dimethyl-4-hexanone, and 2,6-dimethyl-4-heptanone. The NTD process 212 removes unexposed portions of the resist layer 206 (in the present disclosure, "unexposed portions" include under-exposed portions), resulting resist patterns 206a standing over the patterning layer 204 as shown in FIG. 2E. An opening 213 is formed between the resist patterns 206a. The opening 213 has a width $CD_2$ along the "x" direction. In the present embodiment, $CD_2$ is greater than $CD_1$ (the target opening width) by Delta.

In operation 118, the method 100 (FIG. 1B) forms an interfacial layer 214 on sidewalls of the resist patterns 206a. Referring to FIG. 2F, the interfacial layer 214 is formed to have a thickness (a dimension along the "x" direction) $W_4$. In the present embodiment, $W_4$ is substantially equal to half of Delta. For example, $W_4$ may be within 5% of half of Delta. Effectively, the width of the opening 213 is "shrunk" by twice of $W_4$, and the new width of the opening 213 equals to ($CD_2-2W_4$) which approximately equals to ($CD_2$-Delta) which equals to the target critical dimension $CD_1$. Since the opening 213 is effectively shrunk by the operation 118, the operation 118 is also referred to as a "shrinking process" in the present disclosure. In an embodiment, the shrinking process 118 may use a Resolution Enhancement Lithography Assisted by Chemical Shrink (RELACS) technique, as disclosed in the commonly-assigned patent U.S. Pat. No. 8,039,195, the entire disclosure of which is incorporated herein by reference. In another embodiment, the shrinking process 118 uses a plasma-assisted polymer deposition technique. For example, the shrinking process 118 may deposit an experimentally known amount (e.g., 0.5 nm per sidewall) of the interfacial layer 214 during a deposition cycle, and repeat as many deposition cycles as necessary to form the interfacial layer 214 with the thickness $W_4$.

Figure 1E:
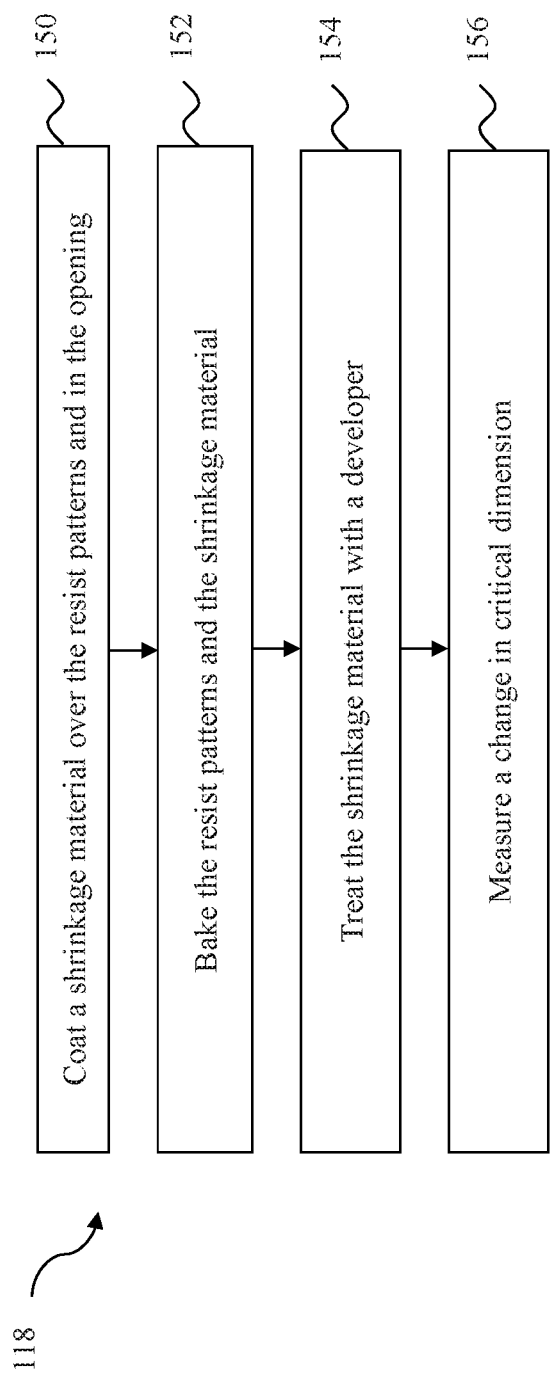
FIG. 1E is a flow chart of a method of shrinking an opening, according to various aspects of the present disclosure.

In the present embodiment, the shrinking process 118 is implemented as an embodiment of the method shown in FIG. 1E. Referring to FIG. 1E, the shrinking process 118 includes steps 150, 152, 154, and 156. In the step 150, the shrinking process 118 deposits (e.g., by spin-coating) a shrinkage material over the resist patterns 206a and in the opening 213. The shrinkage material includes cross-linkable polymer and cross-linker. In the step 152, the shrinking process 118 bakes the resist patterns 206a and the shrinkage material at a suitable temperature such as from 50 degrees Celsius to 250 degrees Celsius. The baking process creates chemical bonds between the resist patterns 206a and the cross-linkable polymer in adjacent shrinkage material, resulting in an interfacial cross-linked polymer layer, the interfacial layer 214, between the resist patterns 206a and the shrinkage material. In the step 154, the shrinking process 118 washes or treats the shrinkage material with a developer that dissolves or otherwise removes the portions of the shrinkage material that are not bonded with the resist patterns 206a, leaving the interfacial layer 214 on the sidewalls of the resist patterns 206a. In the present embodiment, the developer includes one or more materials selected from the group consisting of 2-heptanone, n-butyl acetate, isoamyl acetate, cyclohexanone, 2-heptanone, 5-methyl-2-hexanone, methyl-2-hydroxyisobutyrate, ethyl lactate, propylene glycol monomethyl ether acetate, n-pentyl acetate, n-butyl propionate, n-hexyl acetate, n-butyl butyrate, isobutyl butyrate, 2,5-dimethyl-4-hexanone, and 2,6-dimethyl-4-heptanone. In the step 156, the shrinking process 118 measures a change in the critical dimension of the opening 213. This involves measuring the critical dimension of the opening 213 before the step 150 and again after the step 154. In an embodiment, the steps 150-156 may be performed during a characterization process for determining the Delta used in operation 112 (See e.g., FIGS. 1A, 2D-1, and 2D-2). The characterization process determines the range of Delta that can be accomplished by the shrinking process 118. In an embodiment, the thickness $W_4$ can be formed in a range from 5 nm to 20 nm, such as from 5 nm to 10 nm.

In the present embodiment, the shrinking process 118 is tuned such that the profile of the interfacial layer 214 provides satisfactory LER and LWR for the combined patterns 206a/214. In another embodiment, the interfacial layer 214 is formed not only on the sidewalls of the resist patterns 206, but also on top of the resist patterns 206a, such as shown in FIG. 2F-1. This advantageously increases the film height of the resist patterns 206a for subsequent etching processes.

Figure 2H:
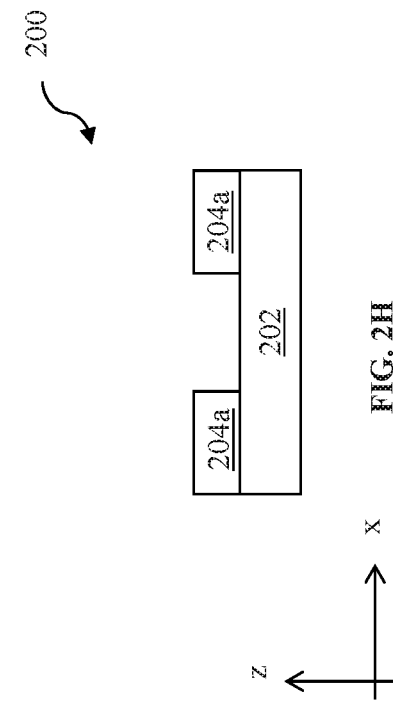
Figure 2G:
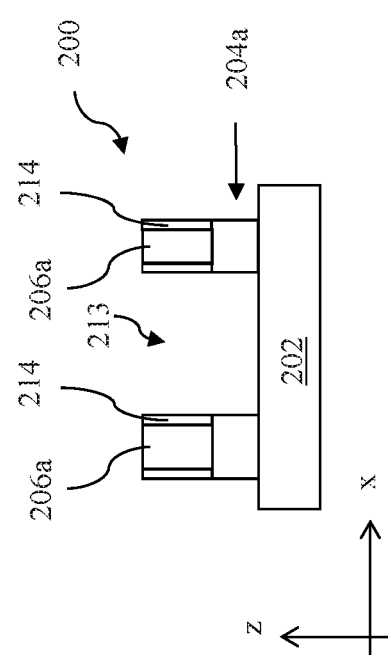

At operation 120, the method 100 (FIG. 1B) etches the patterning layer 204 with the combined patterns 206a/214 as an etch mask. Referring to FIG. 2G, the patterning layer 204 is etched using one or more wet etching, dry etching, or other suitable etching techniques. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The combined patterns 206a/214 may be partially consumed during the etching of the patterning layer 204. Any remaining portion of the combined patterns 206a/214 may be stripped off, leaving patterns 204a over the substrate 202, as illustrated in FIG. 2H.

At operation 122, the method 100 (FIG. 1B) proceeds to further operations to form a final pattern or an IC device. In an embodiment, the substrate 202 is a semiconductor substrate and the method 100 proceeds to forming FinFET structures. To further this embodiment, operation 122 forms a plurality of active fins in the semiconductor substrate 202. The active fins have a substantially uniform CD, due to the low LER and LWR of the combined patterns 206a/214. In another embodiment, the method 100 proceeds to forming a plurality of contact holes in the device 202. The contact holes have a substantially uniform CD due to the low LER and LWR of the combined patterns 206a/214. The method 100 may proceed to filling the contact holes with a contact barrier layer and a metal layer to form contacts for electrically contacting source, drain, or gate features.

Although not intended to be limiting, one or more embodiments of the present disclosure provide many benefits to a semiconductor device and a formation process thereof. For example, embodiments of the present disclosure form combined patterns that include resist patterns and an interfacial layer. The combined patterns provide lower LER and LWR than resist patterns produced by typical EUV lithography. Embodiments of the present disclosure are able to reduce patterns' critical dimensions without increasing radiation source power and without increasing resist sensitivity. Instead, a reduced radiation source power may be used by lithography patterning techniques according to the present disclosure. Furthermore, embodiments of the present disclosure do not require the modifications of the mask in order to produce larger CDs in the resist patterns. That means the same mask may be used in other lithography system or with other types of resist to produce resist patterns equivalent to the combined resist/interfacial patterns of the present disclosure.

In one exemplary aspect, the present disclosure is directed to a method of lithography patterning. The method includes forming a resist layer over a substrate and providing a radiation with a first exposure dose to define an opening to be formed in the resist layer. The opening is to have a target critical dimension $CD_1$ after developed by a negativ-tone development (NTD) process. The method further includes exposing the resist layer to the radiation with a second exposure dose that is less than the first exposure dose. The method further includes developing the resist layer in the NTD process to remove unexposed portions of the resist layer, resulting in a first opening between exposed portions of the resist layer, wherein a critical dimension $CD_2$ of the first opening is greater than $CD_1$ by a delta. The method further includes forming an interfacial layer on sidewalls of the exposed portions of the resist layer, wherein the interfacial layer is formed to have a thickness that is substantially equal to half of the delta.

In another exemplary aspect, the present disclosure is directed to a method of lithography patterning. The method includes forming a resist layer over a substrate; providing a photomask that defines first patterns to be formed in the resist layer; and providing a EUV radiation that is patterned with the photomask. An exposure dose of the EUV radiation is tunable and, if the resist layer is exposed by the EUV radiation with a first exposure dose, the first patterns in the resist layer are to have respective first widths along a first direction. The method further includes exposing the resist layer to the EUV radiation with a second exposure dose less than the first exposure dose such that exposed portions of the resist layer corresponding to the first patterns have respective second widths along the first direction and that the second widths are smaller than the respective first widths by a delta. The method further includes developing the resist layer in a negative-tone development (NTD) process to remove unexposed portions of the resist layer, resulting in the exposed portions of the resist layer over the substrate. The method further includes forming an interfacial layer on sidewalls of the exposed portions of the resist layer, wherein the interfacial layer is formed to have a thickness that is substantially equal to half of the delta.

In yet another exemplary aspect, the present disclosure is directed to a method of lithography patterning. The method includes forming a resist layer over a substrate; providing a photomask that defines an opening to be formed in the resist layer using a negative-tone development (NTD) process; and providing a radiation that is patterned with the photomask, wherein an exposure dose of the radiation is tunable. The method further includes determining a first exposure dose for the radiation, wherein the opening in the resist layer is to have a first critical dimension when the resist layer is exposed to the radiation with the first exposure dose and is developed by the NTD process. The method further includes determining a second exposure dose that is smaller than the first exposure dose, wherein the opening in the resist layer is to have a second critical dimension when the resist layer is exposed to the radiation with the second exposure dose and is developed by the NTD process, wherein the second critical dimension is greater than the first critical dimension by a delta. The method further includes exposing the resist layer to the radiation with the second exposure dose; developing the resist layer using the NTD process, resulting in the opening in the resist layer with the second critical dimension; and forming an interfacial layer on sidewalls of the opening, wherein the interfacial layer has a thickness that is substantially equal to half of the delta.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
   forming a resist layer over a substrate;
   providing a radiation with a first exposure dose to define an opening to be formed in the resist layer, wherein the opening is to have a target critical dimension $CD_1$ after developed by a negativ-tone development (NTD) process;
   exposing the resist layer to the radiation with a second exposure dose that is less than the first exposure dose;
   developing the resist layer in the NTD process to remove unexposed portions of the resist layer, resulting in a first opening between exposed portions of the resist layer, wherein a critical dimension $CD_2$ of the first opening is greater than $CD_1$ by a delta; and
   forming an interfacial layer on sidewalls of the exposed portions of the resist layer, wherein the interfacial layer is formed to have a thickness that is substantially equal to half of the delta.

2. The method of claim 1, wherein the forming of the interfacial layer includes performing a shrinking process to the first opening.

3. The method of claim 2, wherein the shrinking process includes:
   coating a shrinkage material over the exposed portions of the resist layer and in the first opening;
   baking the exposed portions of the resist layer and the shrinkage material at a first temperature to create bonds between portions of the shrinkage material and the exposed portions of the resist layer; and
   treating the shrinkage material with a developer, thereby removing other portions of the shrinkage material that are not bonded with the exposed portions of the resist layer.

4. The method of claim 2, further comprising:
   determining the delta by performing the shrinking process on a test wafer and measuring a change of critical dimension in a pattern by the shrinking process.

5. The method of claim 1, wherein the opening corresponds to one of: a wire trench, a contact hole, and a via hole.

6. The method of claim 1, further comprising:
   performing a characterization process to determine the first and second exposure doses.

7. The method of claim 6, wherein the characterization process includes the steps of:

coating a second resist layer on a wafer, the second resist layer having substantially same material and thickness as the resist layer;

exposing the second resist layer to the radiation with an exposure dose matrix, wherein a plurality of portions of the second resist layer are exposed with a plurality of different exposure doses respectively;

developing the second resist layer by the NTD process, resulting in a plurality of openings in the second resist layer; and deriving a relation between the different exposure doses and critical dimensions of the plurality of openings.

8. The method of claim 7, wherein the characterization process further includes determining the second exposure dose based on the relation, the first exposure dose, and the delta.

9. The method of claim 6, wherein the characterization process includes the steps of:

coating a second resist layer on a wafer, the second resist layer having substantially same material and thickness as the resist layer;

exposing the second resist layer to the radiation with an exposure dose;

developing the second resist layer by the NTD process, resulting in a second opening in the second resist layer; and measuring a critical dimension of the second opening.

10. The method of claim 9, wherein the characterization process further includes:

repeating the steps of coating, exposing, developing, and measuring, wherein each repetition of the exposing step uses a different exposure dose, thereby deriving a series of relations between exposure doses of the radiation and critical dimensions of the second opening.

11. The method of claim 10, wherein the characterization process further includes determining the second exposure dose based on the series of relations, the first exposure dose, and the delta.

12. A method for lithography patterning, comprising:

forming a resist layer over a substrate;

providing a photomask that defines first patterns to be formed in the resist layer;

providing a EUV radiation that is patterned with the photomask, wherein an exposure dose of the EUV radiation is tunable, and wherein, if the resist layer is exposed by the EUV radiation with a first exposure dose, the first patterns in the resist layer are to have respective first widths along a first direction;

exposing the resist layer to the EUV radiation with a second exposure dose less than the first exposure dose such that exposed portions of the resist layer corresponding to the first patterns have respective second widths along the first direction and that the second widths are smaller than the respective first widths by a delta;

developing the resist layer in a negative-tone development (NTD) process to remove unexposed portions of the resist layer, resulting in the exposed portions of the resist layer over the substrate; and forming an interfacial layer on sidewalls of the exposed portions of the resist layer, wherein the interfacial layer is formed to have a thickness that is substantially equal to half of the delta.

13. The method of claim 12, further comprising:

performing a characterization process to determine the first and second exposure doses, wherein the characterization process includes the steps of:

coating a second resist layer on a wafer, the second resist layer having same material and thickness as the resist layer;

exposing the second resist layer by the EUV radiation with an exposure dose;

developing the second resist layer by the NTD process, resulting in a second opening in the second resist layer; and measuring a critical dimension of the second opening.

14. The method of claim 13, wherein the characterization process further includes:

repeating the steps of coating, exposing, developing, and measuring, wherein each repetition of the exposing step uses a different exposure dose, thereby deriving a series of relations between exposure doses of the EUV radiation and critical dimensions of the second opening.

15. The method of claim 12, wherein the exposing of the resist layer to the EUV radiation includes determining the second exposure dose based on the first exposure dose, the delta, and a relation between exposure doses of the EUV radiation and expected critical dimensions of openings in the resist layer.

16. The method of claim 12, further comprising:

performing a characterization process to determine the first and second exposure doses, wherein the characterization process includes the steps of:

coating a second resist layer on a wafer, the second resist layer having substantially same material and thickness as the resist layer;

exposing the second resist layer to the EUV radiation with an exposure dose matrix, wherein a plurality of portions of the second resist layer are exposed with a plurality of different exposure doses respectively;

developing the second resist layer by the NTD process, resulting in a plurality of openings in the second resist layer;

deriving a relation between the different exposure doses and critical dimensions of the plurality of openings; and determining the second exposure dose based on the relation, the first exposure dose, and the delta.

17. A method for lithography patterning, comprising:

forming a resist layer over a substrate;

providing a photomask that defines an opening to be formed in the resist layer using a negative-tone development (NTD) process;

providing a radiation that is patterned with the photomask, wherein an exposure dose of the radiation is tunable;

determining a first exposure dose for the radiation, wherein the opening in the resist layer is to have a first critical dimension when the resist layer is exposed to the radiation with the first exposure dose and is developed by the NTD process;

determining a second exposure dose that is smaller than the first exposure dose, wherein the opening in the resist layer is to have a second critical dimension when the resist layer is exposed to the radiation with the second exposure dose and is developed by the NTD process, wherein the second critical dimension is greater than the first critical dimension by a delta;

exposing the resist layer to the radiation with the second exposure dose;

developing the resist layer using the NTD process, resulting in the opening in the resist layer with the second critical dimension; and forming an interfacial layer on sidewalls of the opening, wherein the interfacial layer has a thickness that is substantially equal to half of the delta.

18. The method of claim 17, wherein the delta ranges from 1 nanometer (nm) to 10 nm.

19. The method of claim 17, further comprising, before the determining of the first expose dose and the determining of the second expose dose:
  performing a characterization process to derive a relation between different exposure doses by the radiation and critical dimensions of openings formed by the NTD process.

20. The method of claim 17, wherein the radiation is EUV radiation and the opening corresponds to one of: a wire trench, a contact hole, and a via hole.

* * * * *